(12) United States Patent
Yamawaki et al.

(10) Patent No.: US 7,224,948 B1
(45) Date of Patent: May 29, 2007

(54) TRANSMITTER AND RADIO COMMUNICATION TERMINAL USING THE SAME

(75) Inventors: Taizo Yamawaki, Tokyo (JP); Satoshi Tanaka, Kokubunji (JP); Masaru Kokubo, Hanno (JP); Kazuo Watanabe, Takasaki (JP); Masumi Kasahara, Takasaki (JP); Kazuaki Hori, Yokohama (JP); Julian Hildersley, Hertfordshire (GB)

(73) Assignees: Hitachi, Ltd., Tokyo (JP); TTP Communications Limited, Hertfordshire (GB)

( * ) Notice: Subject to any disclaimer, the term of this patent is extended or adjusted under 35 U.S.C. 154(b) by 0 days.

(21) Appl. No.: 10/148,960

(22) PCT Filed: Jan. 11, 2000

(86) PCT No.: PCT/JP00/00070

§ 371 (c)(1),
(2), (4) Date: Jun. 7, 2002

(87) PCT Pub. No.: WO01/52427

PCT Pub. Date: Jul. 19, 2001

(51) Int. Cl.
*H04B 1/04* (2006.01)
*H01Q 11/12* (2006.01)

(52) U.S. Cl. .................... 455/119; 455/180.1; 375/376

(58) Field of Classification Search ............ 455/180.1, 455/314, 315, 552.1, 84, 182.3, 176.1, 180.3; 375/376
See application file for complete search history.

(56) References Cited

U.S. PATENT DOCUMENTS 5,194,829 A 3/1993 Schoffel 6,161,000 A 12/2000 Yang et al.
6,163,684 A * 12/2000 Birleson .................. 455/182.3
6,201,952 B1 * 3/2001 Shimizu et al. .......... 455/180.1

FOREIGN PATENT DOCUMENTS

EP 0475509 A1 3/1992

(Continued)

OTHER PUBLICATIONS

"RF Microelectronics", Chapter 7.4.3, Behzad Razavi, (ISBN0-13-887571-5), Prentice Hall, Inc. Press.

*Primary Examiner*—Joseph Feild
*Assistant Examiner*—S. Smith
(74) *Attorney, Agent, or Firm*—Mattingly, Stanger, Malur & Brundidge, P.C

(57) ABSTRACT

There are provided a transmitter and a wireless communication terminal apparatus using the same for solving a problem of undesired spurs due to harmonics of an output signal of a frequency synthesizer, and further solving a problem of the undesired spurs occurring when the harmonics of an output signal of a crystal oscillator are mixed into a VCO to facilitate to design a circuit or a mounting substrate. The transmitter has a relationship between an output frequency of a PLL frequency conversion circuit (5) and output frequencies of frequency synthesizers (1, 2) stored therein, and the output frequencies of the frequency synthesizers (1, 2) input into the PLL frequency conversion circuit (5) are controlled on the basis of the relationship so that the undesired spurs are suppressed. Thereby, even when the undesired spurs occur in the output of the transmitter due to a crosstalk between circuits or through a substrate, which can be easily suppressed, it is therefore possible to reduce time and cost for redesigning the circuit or the substrate.

14 Claims, 6 Drawing Sheets

FOREIGN PATENT DOCUMENTS

| | | |
|---|---|---|
| EP | 0964523 A1 | 12/1999 |
| JP | 54-5319 | 1/1979 |
| JP | 3-204286 | 9/1991 |
| JP | 4-227128 | 8/1992 |
| JP | 8-88582 | 4/1996 |
| JP | 9-162767 | 6/1997 |
| JP | 9-261122 | 10/1997 |
| JP | 9-294089 | 11/1997 |
| JP | 10-285060 | 10/1998 |
| JP | 11-289275 | 10/1999 |
| JP | 11-355138 | 12/1999 |

* cited by examiner

TRANSMITTER AND RADIO COMMUNICATION TERMINAL USING THE SAME

This is a U.S. national stage of application under 35 U.S.C. §371 of international stage application No. PCT/JP00/00070, filed on Jan. 11, 2000, and from which priority was properly claimed in the aforementioned international stage application.

TECHNICAL FIELD

The present invention relates to a transmitter including a frequency synthesizer and a PLL frequency conversion circuit and to a wireless communication terminal apparatus using the same used in a wireless communication system such as the GSM, the DCS1800, or the like.

BACKGROUND ART

Generally, the following three types are considered as a configuration of a transmitter used in a wireless communication terminal apparatus. (1) An architecture for mixing a base band signal with a local signal having the same frequency as a transmission frequency in a modulator. (2) An architecture for, after temporarily upconverting a base band signal to an intermediate frequency in a modulator, upconverting it to a transmission frequency by using a mixer. (3) An architecture for, after temporarily upconverting a base band signal to an intermediate frequency in a modulator, converting it to a transmission frequency in a PLL frequency conversion circuit.

In the architecture (3), since only a constant envelope modulation can be handled as a modulation architecture, architectures (1) and (2) have been mainstream as the architecture of the transmitter. However, since the GSM and the DCS1800 system rapidly widespread in recent years employ the constant envelope modulation as the modulation architecture, the architecture (3) having various advantages has been started to widely use. The advantages of the architecture (3) include: (1) that an expensive filter having a high Q value is not required in the transmitter according to filter characteristics which the PLL has, (2) that, since a VCO output signal is a constant envelope signal, a bias design of a power amplifier at the next stage of the PLL frequency conversion circuit becomes easy, and the like.

Here, the present inventors have investigated the transmitter according to the aforementioned architecture (3). The following is not a well-known technique, but a technique investigated by the present inventors, an outline thereof will be described with reference to FIGS. 6 to 9. FIG. 6 shows a transmitter of the architecture (3) according to a comparative example which is an assumption of the present invention. This transmitter is configured with a first frequency synthesizer 38, a second frequency synthesizer 39, a crystal oscillator 40 for giving reference signals to the first and second frequency synthesizers, a PLL frequency conversion circuit 41, a divider 47, a modulator 54, and a base band circuit 42.

The first frequency synthesizer 38 is configured with a first counter 42, a second counter 43, a phase comparator 44, a low pass filter 45, and a VCO 46, where an output signal of the VCO 46 is input into the divider 47.

The second frequency synthesizer 39 is configured with a third counter 48, a fourth counter 49, a phase comparator 50, a low pass filter 51, and a VCO 52, where an output signal of the VCO 52 which is a frequency fRF is input into a mixer 53.

On the basis of information signals such as a sound, various data, and the like, the base band circuit 42 is a circuit for generating a waveform of a base band signal or generating various data for controlling this transmitter.

Assuming a local signal output from the first frequency synthesizer 38 to be an input signal, the divider 47 divides this local signal into a frequency fIF, and inputs it into the modulator 54.

The modulator 54 mixes the signal of the frequency fIF supplied from the divider 47 into a base band signal from the base band circuit 42, and upconverts it to an intermediate frequency (for example, 270 MHz).

The PLL frequency conversion circuit 41 is configured with a phase comparator 55, a low pass filter 56, a VCO 57, and the mixer 53. Two signals are input into the phase comparator 55. A first input signal is an output signal of the modulator 54, and a second input signal is an output signal of the mixer 53. In the phase comparator 55, the first and second input signals are phase-compared with each other, and a signal proportional to a phase difference is output. The output signal of the phase comparator 55 is output to the low pass filter 56, where undesired noises are eliminated, and is then input into the VCO 57. The output frequency of the VCO 57 is an fVCO, which is used as an output signal of this transmitter and is input into the mixer 53. Two signals are input into the mixer 53. A first input signal is an output signal of the VCO 57, and a second input signal is a local signal of the frequency fRF supplied from the second frequency synthesizer 39. The output frequency of the mixer 53 is an absolute value of a difference between the two input frequencies, which becomes |fRF−fVCO|. The output signal of the mixer 53 becomes the second input signal of the phase comparator 55. Since, when the PLL frequency conversion circuit 41 is in a locked state, the two input frequencies of the phase comparator 55 are equal to each other, fIF=|fRF−fVCO| is obtained. Therefore, the output frequency fVCO of the VCO 57 is given as |fRF−fIF|. In other words, the output frequency fIF of the modulator 54 is frequency converted to fVCO=|fRF−fIF| in the output of the transmitter. In order to change the output frequency of the transmitter, the output frequency fRF of the second frequency synthesizer 39 is changed while the output frequency of the first frequency synthesizer 38 remains fixed.

Next, an example of closed-loop characteristics of the PLL frequency conversion circuit 41 is shown in FIG. 7. A flat portion of 0 dB is a bandpass. Since the frequency of the horizontal axis denotes a offset frequency from the output frequency fVCO, it is found that the PLL frequency conversion circuit 41 has bandpass filter characteristics around the output frequency. In other words, when the bandpass width is set to be wider than the bandwidth in the modulation architecture prescribed in the system such as the GSM or the like, the PLL frequency conversion circuit 41 can hold an output spectrum of the modulator 54, and convert the center frequency. Actually, in view of the phase difference and the noise level at the output of the PLL frequency conversion circuit 41, the bandpass width is designed to be about 1 to 2 MHz.

Needs for low cost, small capacity, and the like have been remarkably required for the wireless communication terminal apparatus, and an integration of a circuit structuring a terminal has been advanced year after year. However, a problem of a crosstalk of signals or harmonics between circuits has occurred along with an enhancement of the integration. Further, an improvement of a semiconductor process in recent years is being advanced in a direction of decreasing a parasitic capacitance, which also promotes the problem of the crosstalk between circuits. Further, a problem of the crosstalk through a mounting substrate has occurred due to a high density mounting such as an IC in a terminal.

FIG. 8 shows measurement results of the transmitter in which circuits surrounded by solid lines 58 and 59 in FIG. 6 are integrated in the same IC. The GSM is assumed as the system, and a GMSK modulation signal is used as the base band signal. The first frequency synthesizer 38 oscillates at 1080 MHz, is quadrant divided in the divider 47, where the fIF is assumed to be 270 MHz. Further, the fRF (=fIF+fVCO) is set so that the fVCO becomes a GSM (including EGSM) transmission frequency (880 MHz to 915 MHz). The horizontal axis denotes the transmission frequency fVCO of the transmitter, and the vertical axis denotes a worst value of a difference between a signal level at the transmission frequency and a signal level at 400 MHz to 1.8 MHz offset and 6 MHz to 25 MHz offset from the transmission frequency by dB. A spectrum analyzer is used to measure the output of the VCO 57, and the measurement conditions thereof are RBW=VBW=30 kHz at 400 kHz to 1.8 MHz offset, and RBW=VBW=100 at 6 MHz to 25 MHz. The specifications with respect to Spurious emissions of the GSM are not more than −60 dB and not more than −71 dB at 400 kHz to 1.8 MHz offset and at not less than 6 MHz offset, respectively. When the transmission frequency is in the vicinity of 900 MHz at 400 kHz to 1.8 MHz offset, it is found that, when the transmission frequency is in the vicinity of 898 MHz and in the vicinity of 902 MHz at 6 MHz to 25 MHz offset, the transmission spectrum is degraded, which does not meet the GSM specification. This is because undesired spurs occur in the offset frequency shown in formula 1 from the transmission frequency due to an intermodulation of harmonics of the fIF, the fRF and the fVCO.

$$\pm |3 \times fVCO - 10 \times fIF| \quad \text{(Formula 1)}$$

Here, a relationship of fVCO=fRF−fIF is present between the fIF, the fRF and the fVCO. The undesired spurs occur as the result that the circuits surrounded by the solid lines 58 and 59 in FIG. 6 are integrated in the same IC so that influences due to the harmonics of the output signals of the first frequency synthesizer 38 and the second frequency synthesizer 39 are increased. Even when the circuits surrounded by the solid lines 58 and 59 are integrated in another IC, there is a possibility that the undesired spurs occur depending on the characteristics of the integrated IC, a semiconductor process to be used, or a method for mounting on a substrate.

Next, FIG. 9 shows an output spectrum of the transmitter in which the circuits surrounded by the solid lines 58 and 59 and the VCO 46 in FIG. 6 are integrated in the same IC. The GSM is assumed as the system, and the GMSK modulation signal is used as the base band signal. The first frequency synthesizer 38 oscillates at 1080 MHz, and is quadrant divided in the divider 47, where the fIF is assumed to be 270 MHz. The fRF is set at 1150 MHz so that the fVCO becomes 880 MHz. Further, the output frequency of the crystal oscillator 40 is 13 MHz. The horizontal axis denotes a frequency, and the vertical axis denotes a signal level by dBm. The measurement is performed by the spectrum analyzer, and the measurement condition is RBW=VBW=30 kHz. The undesired spurs occur at 1 MHz offset from the transmission frequency, and the level thereof is −58.2 dB. As described above, in the GSM specification, the level is prescribed to be not more than −60 dB at 400 kMz to 1.8 MHz offset, and the measurement result in FIG. 9 does not meet the GSM specification. The occurrence process of the undesired spurs is as follows. Harmonics of 1079 MHz which is 83 times the output signal of the crystal oscillator 40 occur in the first frequency synthesizer 38 or the second frequency synthesizer 39. This 1079 MHz signal is mixed into the VCO 46 due to the crosstalk. When the VCO is regarded as a positive feedback circuit, this 1079 MHz signal is amplified in the VCO 46, and at the same time, the undesired spurs also occur at 1081 MHz due to a folded operation around the oscillation frequency 1080 MHz by odd-order nonlinearity characteristics of the amplifier. Details of the folded operation of the noises in the VCO are described in chapter 7.4.3 in Prentice Hall PTR Prentice-Hall, Inc. Press, Behzad Razavi, "RF MICROELECTRONICS" (ISBNO-13-887571-5).

As a result that the present inventors have investigated the transmitter according to the comparative example which is the assumption of the present invention, the followings have become apparent. The transmitter according to the aforementioned comparative example has the problems of the undesired spurs described later due to a progress of the integration of a circuit, a deterioration of the parasitic capacitance due to the improvement of the semiconductor process, or the high density mounting of a terminal.

A first problem (1) is in that the undesired spurs occur at a specific transmission frequency due to the harmonics of the output signal of the frequency synthesizer.

A second problem (2) is in that, when the harmonics of the output signal of the crystal oscillator are present in the vicinity of the oscillation frequency of the VCO, the undesired spurs occur in the VCO output due to the folded operation of the VCO.

Further, since it is difficult to predict the crosstalk between circuits or the crosstalk through a mounting substrate on designing the circuit or the mounting substrate so that it is required that improvements are added after actual manufacture and measurement have been performed, and a large amount of labor and cost has been required.

Therefore, it is a first object of the present invention to solve the problem of the undesired spurs due to the harmonics of the output signal of the frequency synthesizer occurring in the transmitter according to the aforementioned comparative example, and to facilitate to design a circuit or a mounting substrate.

Further, it is a second object of the present invention to solve the problem of the undesired spurs due to the harmonics of the output signal of the frequency synthesizer in the transmitter according to the aforementioned comparative example, and, at the same time, to solve the problem of the undesired spurs occurring when the harmonics of the output signal of the crystal oscillator are mixed into the VCO, and to facilitate to design a circuit or a mounting substrate.

The above and other objects and novel features according to the present invention will be apparent from the description and accompanying drawings of the present specification.

DISCLOSURE OF THE INVENTION

Among the inventions disclosed in this application, an outline of a representative one will be briefly described as follows.

In order to solve the above problem (1), a transmitter according to the present invention is a transmitter comprising a first frequency synthesizer; a second frequency synthesizer; a base band circuit for outputting a base band signal and a control signal on the basis of an information signal; a control circuit for changing output frequencies of the first frequency synthesizer and the second frequency synthesizer on the basis of the control signal; a modulator for assuming an output signal from the first frequency synthesizer to be a carrier signal and modulating the carrier signal on the basis of the base band signal; and a frequency conversion circuit for using an output signal form the modulator and an output signal from the second frequency synthesizer to upconvert a carrier frequency of the output signal from the modulator.

Further, the frequency conversion circuit is a PLL frequency conversion circuit comprising a first phase comparator; a first low pass filter; a first VCO; and a mixer; wherein the first phase comparator outputs a signal proportional to a phase difference between an output signal from the modulator and an output signal from the mixer; the first low pass filter is connected to an output of the first phase comparator; the first VCO is connected to an output of the first low pass filter; and the mixer is adopted to mix an output signal from the first VCO and an output signal from the second frequency synthesizer.

Further, the base band circuit is a base band circuit which stores a relationship between an output frequency of the frequency conversion circuit and output frequencies of the first frequency synthesizer and the second frequency synthesizer and generates the control signal corresponding to the output frequency of the frequency conversion circuit on the basis of the relationship. The relationship is a relationship where undesired spurs equal to or more than a level prescribed in a wireless system do not occur in an output of the PLL frequency conversion circuit.

Further, the first frequency synthesizer comprises a first counter; a second counter; a second phase comparator; a second low pass filter; and a second VCO; wherein the second phase comparator outputs a signal proportional to a phase difference between an output signal from the first counter and an output signal from the second counter; the first counter is connected to an output of a reference oscillator; the second counter is connected to an output of the second VCO; the second low pass filter is connected to an output of the second phase comparator; the second VCO is connected to an output of the second low pass filter; and a frequency ratio of the second counter can be changed by first frequency ratio data transmitted from the control circuit.

Further, the second frequency synthesizer comprises a third counter; a fourth counter; a third phase comparator; a third low pass filter; and a third VCO, wherein the third phase comparator outputs a signal proportional to a phase difference between an output signal from the third counter and an output signal from the fourth counter; the third counter is connected to an output of the reference oscillator; the fourth counter is connected to an output of the third VCO; the third low pass filter is connected to an output of the third phase comparator; the third VCO is connected to an output of the third low pass filter; and a frequency ratio of the fourth counter can be changed by second frequency ratio data transmitted from the control circuit.

Further, the control circuit comprises a first register for holding third frequency ratio data; a second register for holding fourth frequency ratio data; a third register for holding the second frequency ratio data; and a first selector for selecting either one item of the third and fourth frequency ratio data on the basis of information included in the control signal and assuming it to be the first frequency ratio data.

Further, in the transmitter, a divider may exist between the second VCO and the modulator.

In the transmitter for solving the above object (1), the first counter, the second counter, the second phase comparator, the third counter, the fourth counter, the third phase comparator, the modulator, the divider, the first phase comparator, the mixer, and the control circuit are formed in the same IC.

Further, in order to simultaneously solve the above problems (1) and (2), a transmitter according to the present invention is the transmitter wherein the control circuit comprises a fourth register for holding fifth frequency ratio data; a fifth register for holding sixth frequency ratio data; a sixth register for holding the seventh frequency ratio data; a seventh register for holding the second frequency ratio data; and a second selector for selecting one item of the fifth, sixth, and seventh frequency ratio data on the basis of information included in the control signal and assuming it to be the first frequency ratio data.

Further, in the transmitter for simultaneously solving the above objects (1) and (2), a divider may be exist between the second VCO and the modulator.

In the transmitter for simultaneously solving the above objects (1) and (2), at least the first counter, the second counter, the second phase comparator, the third counter, the fourth counter, the third phase comparator, and the second VCO are manufactured in the same IC, preferably, the modulator, the divider, the first phase comparator, the mixer, and the control circuit are further formed in the same IC.

Further, a wireless communication terminal apparatus according to the present invention is a wireless communication terminal apparatus comprising a base band circuit for outputting a base band signal and a control signal on the basis of an information signal; a transmitting circuit to which the base band signal and the control signal are input; the receiving circuit to which a first output signal and a second output signal from the transmitting circuit are input; a power amplifier to which a third output signal from the transmitting circuit is input, an antenna switch connected to an input of the receiving circuit and to an output of the power amplifier; and an antenna connected to the antenna switch, wherein the transmitting circuit is a transmitter according to any one of the above aspects; the first output signal and the second output signal are an output signal from a second frequency synthesizer and an input signal to a modulator both in the transmitting circuit; the third output signal is an output signal from a first VCO provided in the transmitting circuit; and an output signal of the receiving circuit is input into the base band circuit in the transmitting circuit, where an information signal is fetched out.

Further, in the wireless communication terminal apparatus, a duplexer may be employed in place of the antenna switch.

Among the inventions disclosed in this application, an effect which can be obtained from the representative one will be briefly described as follows.

According to the present invention, even when the undesired spurs occur in the output of the transmitter including the frequency synthesizer and the PLL frequency conversion circuit due to the crosstalk between circuits or the crosstalk on the substrate which is difficult to predict at the design, the output frequency of the frequency synthesizer is appropriately changed according to the output frequency of the PLL frequency conversion circuit so that the undesired spurs can be suppressed. Thereby, an effect can be obtained in which time and cost for redesigning the circuit or the substrate can be reduced.

BEST MODE FOR CARRYING OUT THE INVENTION

Hereinafter, embodiments according to the present invention will be described in detail with reference to the drawings. Throughout the drawings for describing the embodiments, like numerals are denoted to like parts, and repeated descriptions thereof will be omitted.

Figure 1:
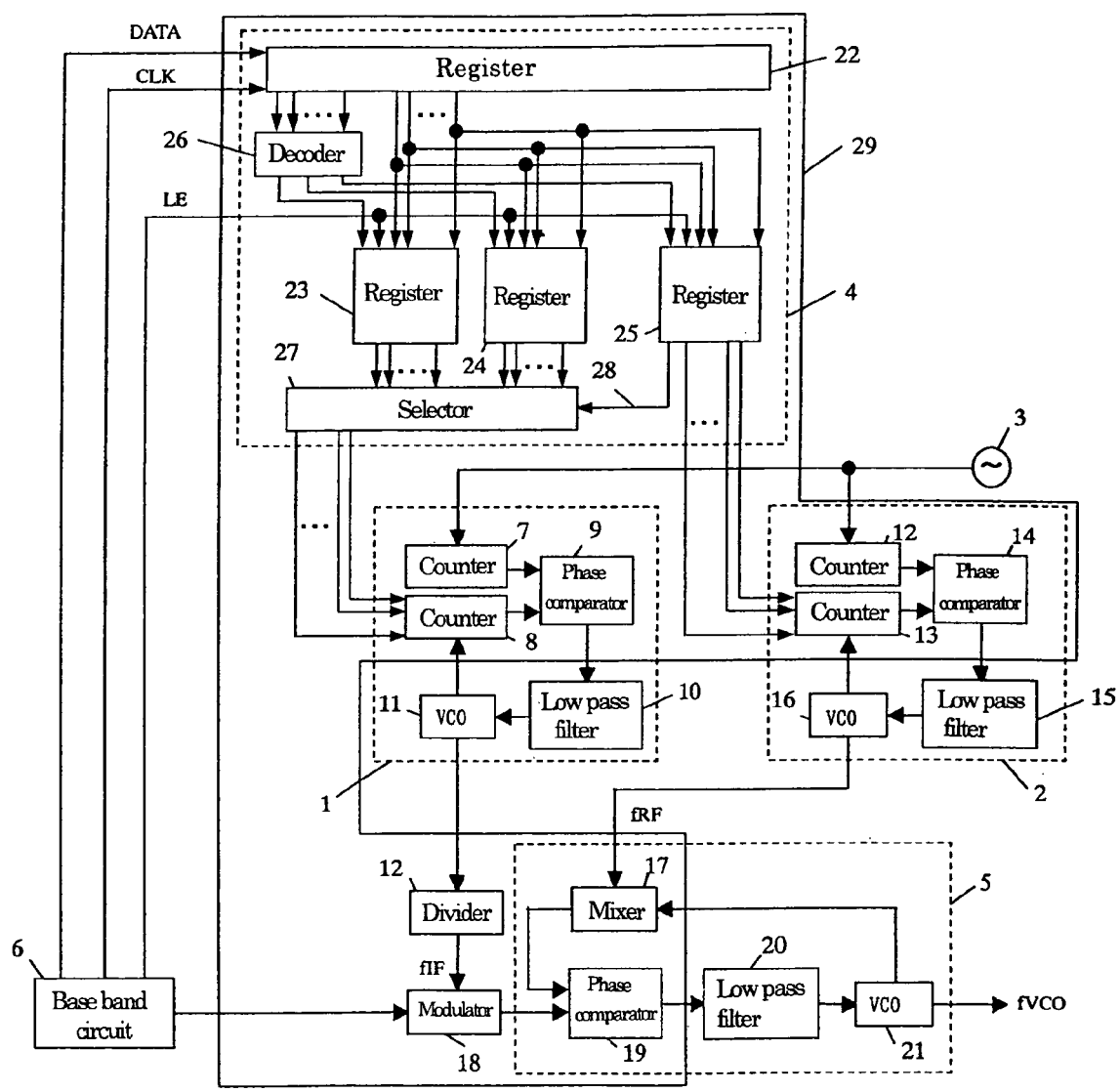
FIG. 1 is a functional block diagram showing an embodiment of a transmitter according to the present invention.

FIG. 1 is a configuration diagram showing a first embodiment of a transmitter according to the present invention, which solves the first object (1).

The transmitter according to the present invention is configured with a first frequency synthesizer 1, a second frequency synthesizer 2, a crystal oscillator 3 for giving reference signals to the first and second frequency synthesizers 1 and 2, a control circuit 4 for the first and second frequency synthesizers 1 and 2, a PLL frequency conversion circuit 5, a divider 12, a modulator 18, and a base band circuit 6.

The first frequency synthesizer 1 is configured with a first counter 7, a second counter 8, a phase comparator 9, a low pass filter 10, and a VCO 11, where an output signal of the VCO 11 is input into the divider 12.

The second frequency synthesizer 2 is configured with a third counter 12, a fourth counter 13, a phase comparator 14, a low pass filter 15, and a VCO 16, where an output signal of the VCO 16 which is a frequency fRF is input into a mixer 17.

On the basis of information signals such as a sound, various data, and the like, the base band circuit 6 is a circuit for generating a waveform of a base band signal or generating various data for controlling the transmitter.

The control circuit 4 is configured with a first register 22, a second register 23, a third register 24, a fourth register 25, a decoder 26, and a selector 27. A clock signal CLK and a data signal DATA are input into the first register 22 from the base band circuit 6, where this DATA is synchronized with this CLK and is stored as serial data. Part of the stored data (for example, higher 3 bits) is input into the decoder 26, and the remaining thereof is input into the second, third and fourth registers 23, 24, and 25. Data from the first register 22 is stored only in one register selected from among the second, third, and fourth registers 23, 24 and 25 by the output signal of the decoder 26. A timing with which the data is stored is determined by a trigger signal (for example, a fall edge) transmitted to the LE. The outputs of the second and third registers 23 and 24 are input into the selector 27. The selector 27 inputs either one of the outputs from the second and third registers 23 and 24 into the counter 8 according to selector data 28 from the fourth register 25. Part of the data (for example, higher 1 bit) stored in the fourth register 25 is output to the selector 27, and the remaining thereof is input into the counter 13 of the second frequency synthesizer 2.

Assuming a local signal output from the first frequency synthesizer 1 to be an input signal, the divider 12 divides this local signal into a frequency fIF, and inputs it into the modulator 18.

The modulator 18 mixes a signal of the frequency fIF supplied from the divider 12 into the base band signal from the base band circuit 6, and upconverts it to an intermediate frequency (for example, 270 MHz).

The PLL frequency conversion circuit 5 is configured with a phase comparator 19, a low pass filter 20, a VCO 21, and a mixer 17. Two signals are input into the phase comparator 19. A first input signal is an output signal of the modulator 18, and a second input signal is an output signal of the mixer 17. In the phase comparator 19, the first and second input signals are phase-compared with each other, and a signal proportional to a phase difference is output. The output signal of the phase comparator 19 is output to the low pass filter 20, where undesired noises are eliminated, and is input into the VCO 21. An output frequency of the VCO 21 is an fVCO, which is used as an output signal of this transmitter and is input into the mixer 17. Two signals are input into the mixer 17. A first input signal is an output signal of the VCO 21, and a second input signal is a signal of the frequency fRF supplied from the second frequency synthesizer 2. The output frequency of the mixer 17 is an absolute value of a difference between the two input frequencies, which is |fRF−fVCO|. The output signal of the mixer 17 becomes the second input signal of the phase comparator 19. A frequency conversion operation and an operation as a bandpass filter of the PLL frequency conversion circuit 5 are similar to a PLL frequency conversion circuit shown in a comparative example which is an assumption of the present invention.

In the transmitter according to the present invention, circuits surrounded by a solid line 29 in FIG. 1 are incorporated in a single IC.

Next, an operation of the transmitter in FIG. 1 will be described.

At first, at an initial operation of this transmitter (for example, when a power supply is turned from OFF to ON), the data is stored in the second register 23, and the data is next stored in the third register 24. For example, the data of the counter 8 where the fIF becomes 270 MHz is stored in the second register 23, and the data of the counter 8 where the fIF becomes 272 MHz is stored in the third register 24. Once the data are stored in the second and third registers 23 and 24, updating of the data will not be performed thereafter. When the output frequency fVCO of this transmitter is updated, the data is input into the fourth register 25 and the data of the counter 13 is updated in each case so that the output frequency fRF of the second frequency synthesizer 2 is updated, and, at the same time, the selector data 28 is given to the selector 27 so that a value of the second or third register 23 or 24 is input into the counter 8 and the output frequency of the first frequency synthesizer 1 is updated.

Next, a description will be given to that a problem of undesired spurs due to harmonics of the output signal of the frequency synthesizer shown in the comparative example which is the assumption of the present invention can be solved by the transmitter in FIG. 1.

Figure 2:
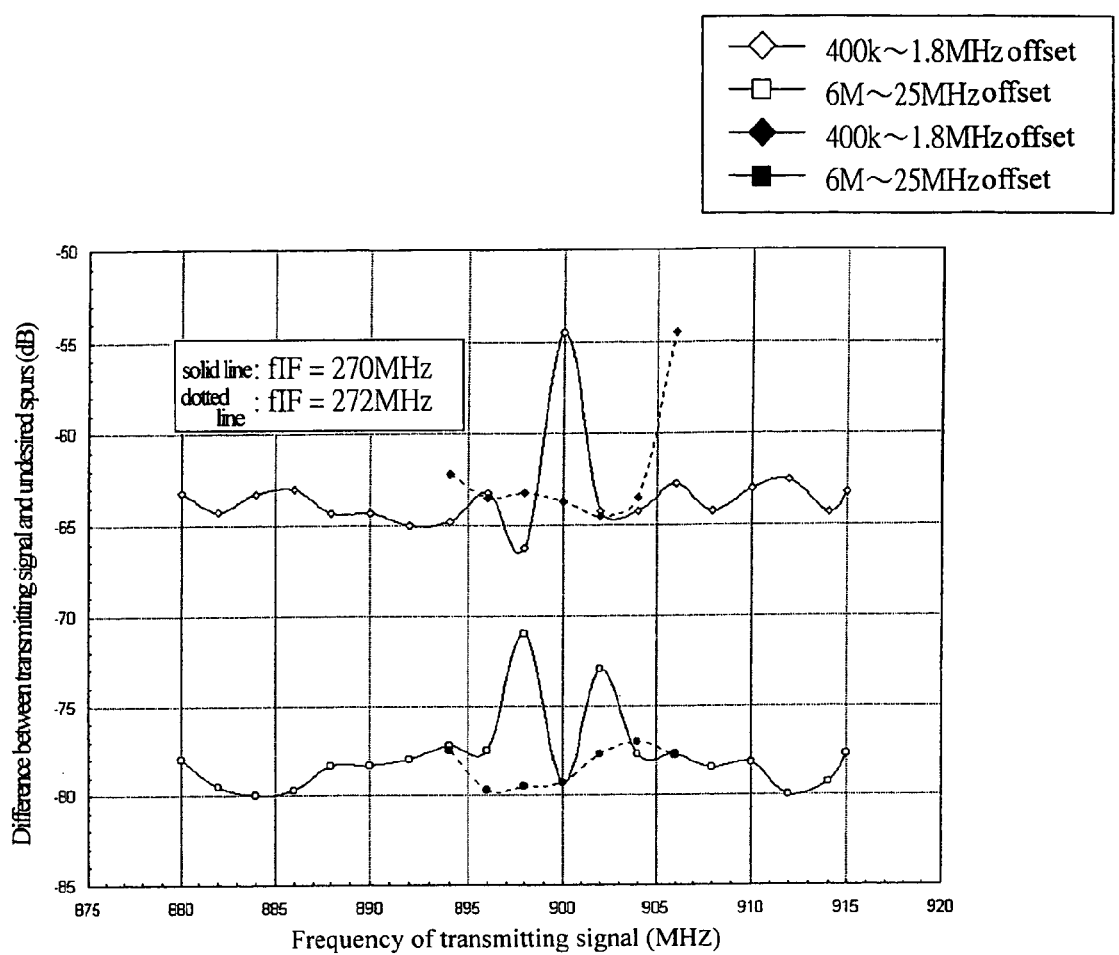
FIG. 2 is a characteristic diagram showing effects of the embodiment of the transmitter according to the present invention.
Figure 8:
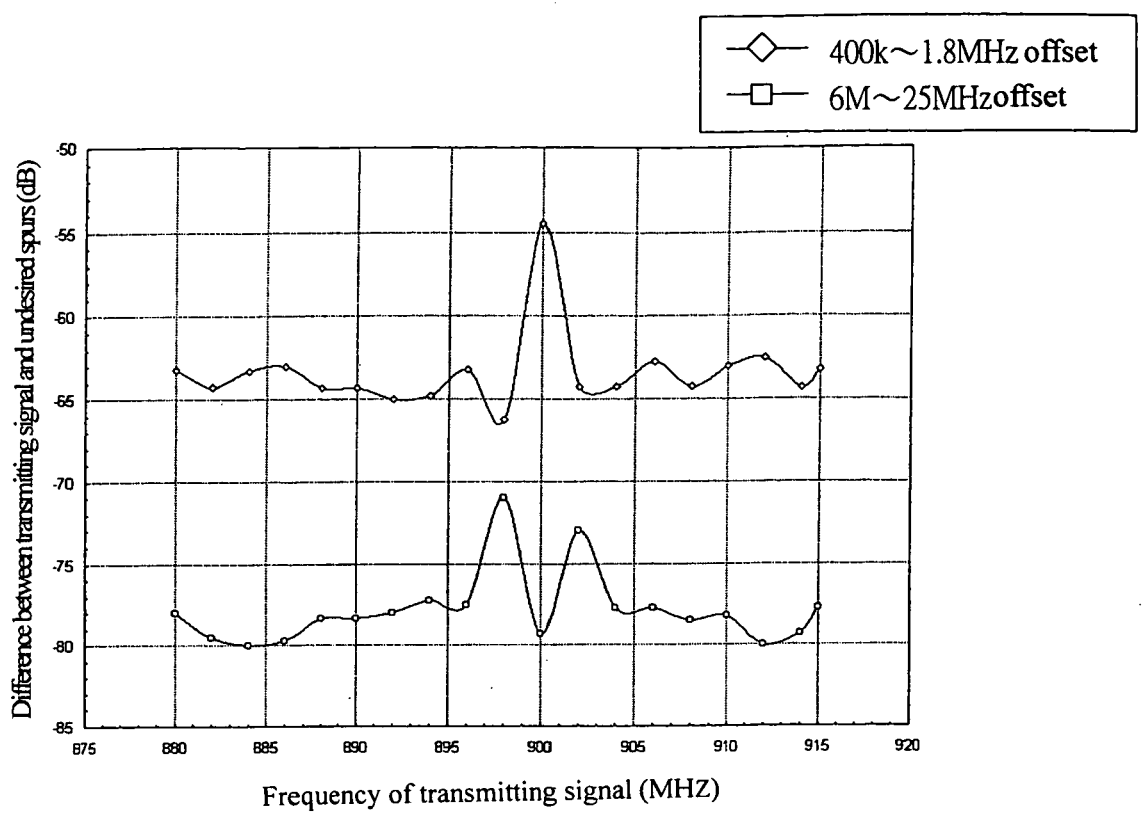
FIGS. 8 and 9 are characteristic diagrams showing measurement results of the transmitter according to the comparative example.

In the comparative example, the undesired spurs have occurred with an offset frequency prescribed by formula 1. For example, when fIF=270 MHz, fRF=1168 MHz, and fVCO=898 MHz are assumed, the undesired spurs occur with ±6 MHz offset. As described in the description of the comparative example, since the PLL frequency conversion circuit 5 has bandpass filter characteristics with a transmission frequency as a center frequency, a level of the undesired spurs can be suppressed by increasing the offset frequency of the undesired spurs. For example, when the fIF and the fRF are assumed to be 272 MHz and 1170 MHz, respectively with the fVCO remained at 898 MHz, the offset frequency of the undesired spurs becomes ±26 MHz offset from formula 1. In FIG. 2, the measurement results of the transmitter when 270 MHz and 272 MHz are used as fIF are shown. Since quadrant dividing is performed in the divider 12, the first frequency synthesizer 1 oscillates at 1080 MHz when fIF=270 MHz is assumed, and oscillates at 1088 MHz when fIF=272 MHz is assumed. Other measurement conditions are similar to the measurement conditions in the comparative example in FIG. 8. The undesired spurs occur in the vicinity of fVCO=900 MHz when fIF=270 MHz is assumed so that the GSM specification cannot be met, however, since the fVCO where the undesired spurs occur is shifted when fIF=272 MHz is assumed, it is found that the undesired spurs are suppressed in the vicinity of fVCO=900 MHz so that the GSM specification can be met. Therefore, for example, when the data of the counter 8 where the fIF becomes 270 MHz is stored in the second register 23, the data of the counter 8 where the fIF becomes 272 MHz is stored in the third register 24, the data of the third register 24 is used as the data of the counter 8 by the selector 27 when the fVCO is in 885 MHz to 905 MHz, and the data of the second register 23 is used as the data of the counter 8 at other fVCO than the above, the GSM specification can be met in all the frequency ranges.

Figure 3:
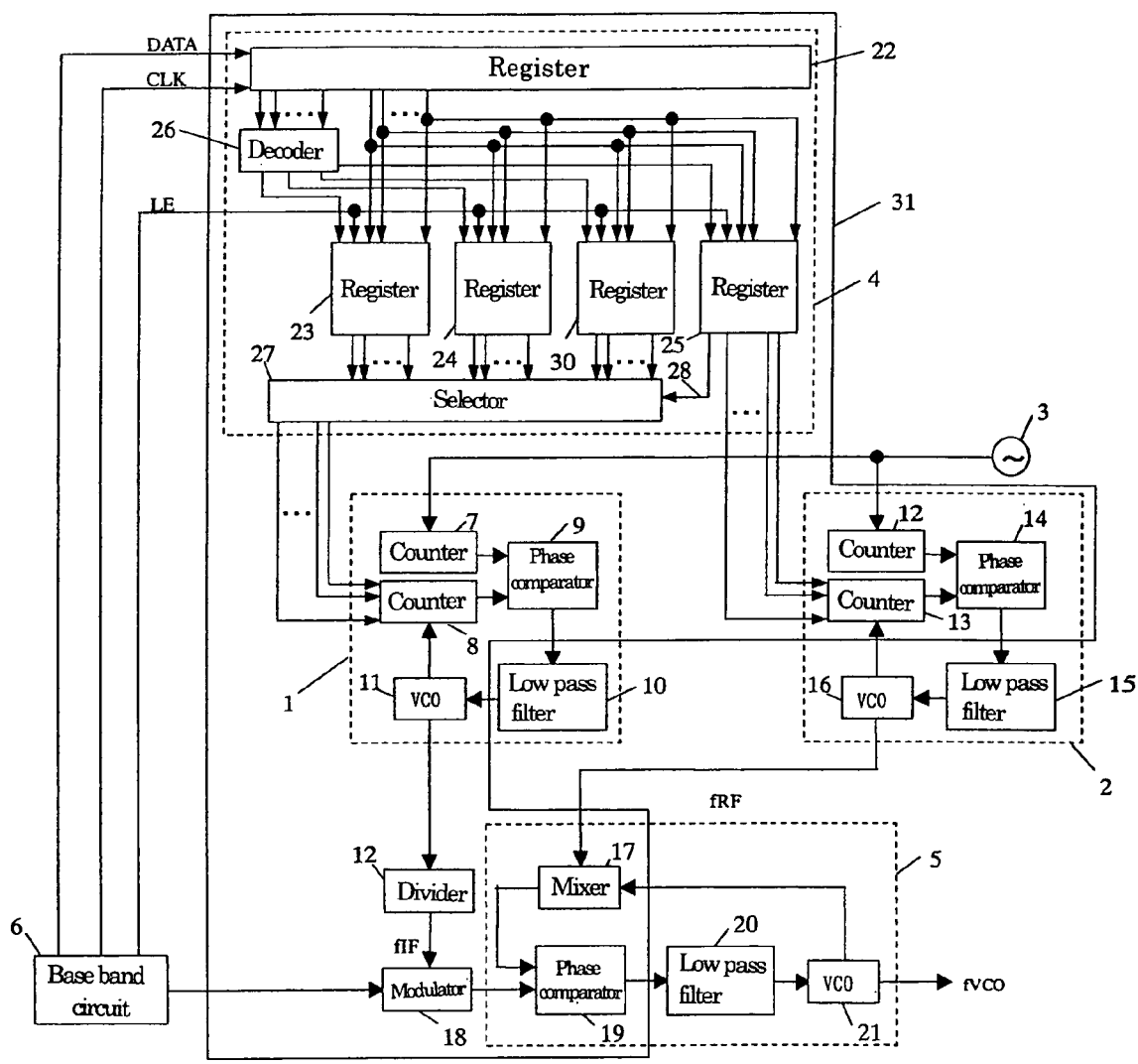
FIG. 3 is a functional block diagram showing another embodiment of the transmitter according to the present invention.

FIG. 3 is a configuration diagram showing a second embodiment of the transmitter according to the present invention, which simultaneously solves the first problem (1) and the second problem (2).

The present embodiment is a transmitter characterized in that the VCO 11 is added to a IC circuit (portion surrounded by a dotted line 29) and further a fifth register 30 is added between the first register 22 and the selector 27 in the first embodiment. Circuits surrounded by a solid line 31 are incorporated in a single IC.

Figure 4:
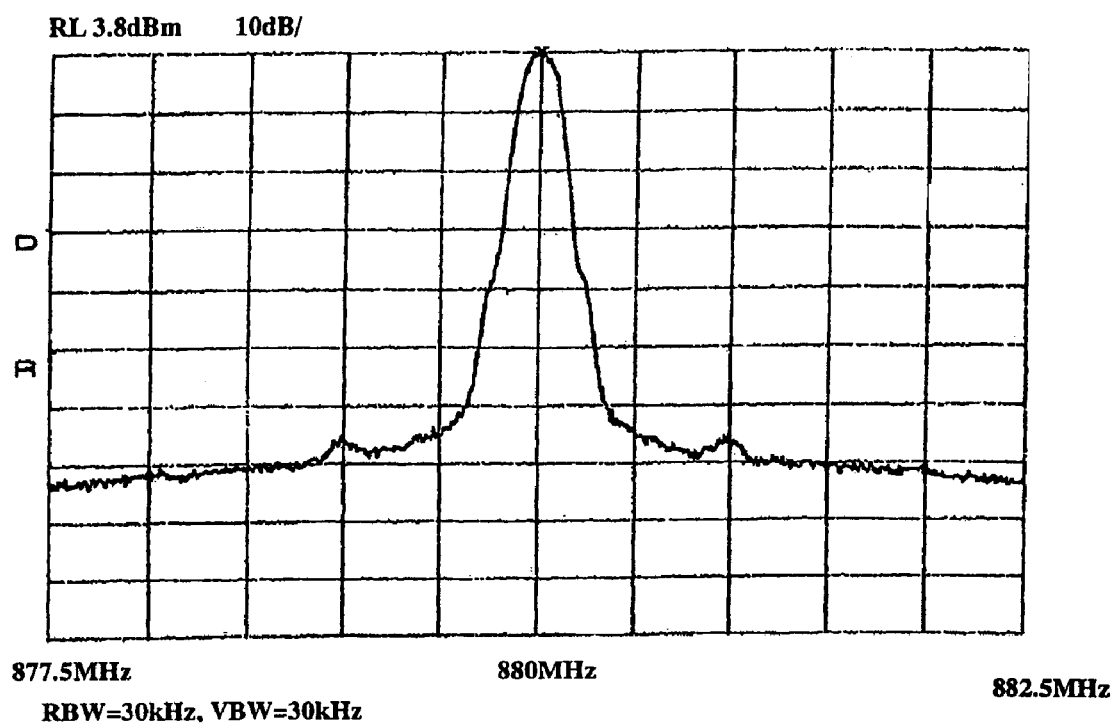
FIG. 4 is a characteristic diagram showing effects of another embodiment of the transmitter according to the present invention.
Figure 9:
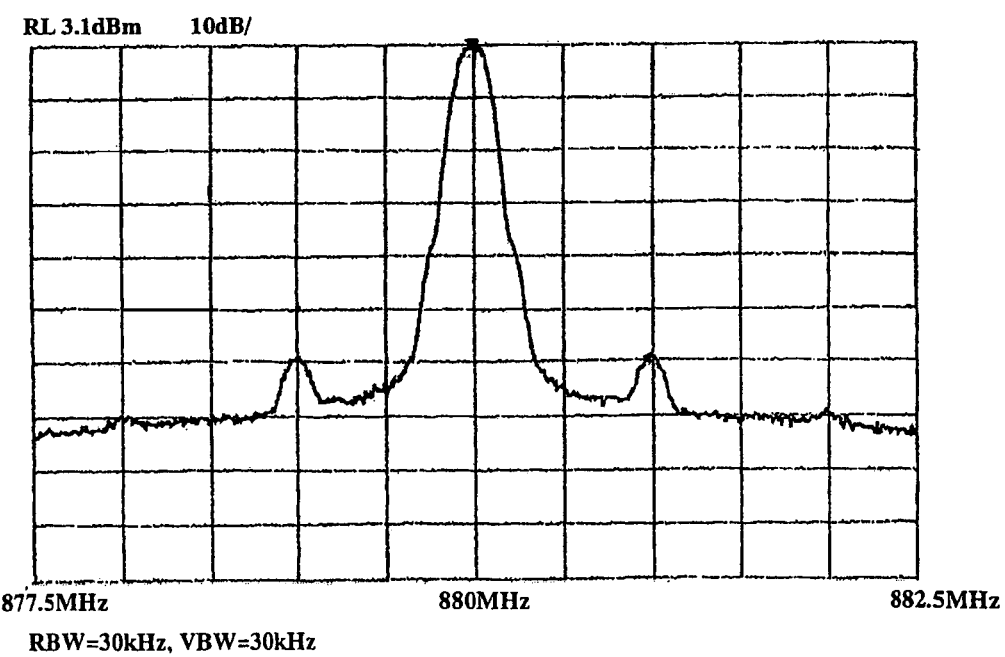

In the aforementioned comparative example, since the harmonics 1079 MHz of the output signal of the crystal oscillator is mixed in the vicinity of the oscillation frequency 1080 MHz of the VCO, the undesired sours have occurred in this VCO output. Generally, the VCO employed in the wireless communication has a resonator, and the resonator has bandpass filter characteristics. Therefore, the oscillation frequency of this VCO is made far from 1079 MHz so that the level of the undesired spurs can be suppressed. FIG. 4 shows an output spectrum of the transmitter when the oscillation frequency of the VCO 11 is assumed to be 1088 MHz, that is, fIF=272 MHz, and fVCO=880 MHz is assumed in the same measurement conditions as the comparative example in FIG. 9. The undesired spurs are suppressed as compared with the comparative example, the level thereof is −66.4 dB. This value meets not more than −60 dB of the GSM specification.

According to the above results, the transmitter according to the present embodiment will be used as follows.

The fIF to be used is, for example, 270 MHz, 272 MHz, and 268 MHz. At first, in order to solve the second problem (2), the output frequency of the first frequency synthesizer 1 is made far from 1079 MHz, and is assumed to be 1088 MHz. In other words, 272 MHz is used as the fIF. Next, since, when only 272 MHz is used as the fIF, the problem of the first problem (1) occurs, 268 MHz is also used as the fIF in order to shift the output frequency fVCO of the transmitter at which the undesired spurs occur. Further, the fIF of 270 MHz is used for a receiver utilizing the output signals of the first frequency synthesizer 1 and the second frequency synthesizer 2. Since the fIF used in this receiver is determined by a filter of this receiver, the fIF cannot be freely changed. Further, since a channel filter having a bandpass width less than 1 MHz is used as this filter, even when, assuming fIF=270 MHz, the spurs of −58.2 dB exist at 1 MHz offset, no problem occurs in the performance of this receiver.

At the initial operation of this transmitter (for example, the power supply is turned from OFF to ON), the data of the counter 8 where the fIF becomes 270 MHz is stored in the second register 23, the data of the counter 8 where the fIF becomes 272 MHz is stored in the third register 24, and the data of the counter 8 where the fIF becomes 268 MHz is stored in the fifth register 30. Once the data are stored in the second, third, and fifth registers 23, 24, and 30, the updating of the data will not be performed thereafter. Since the GSM system is the TDMA (Time Division Multiple Access) architecture, transmission and reception cannot occur at the same time. Therefore, on the transmission, the selector 27 is appropriately switched according to the transmission frequency fVCO, and the data of this third or fifth register 24 or 30 is input into the counter 8. On the reception, the second register 23 is selected by the selector 27, and the data thereof is input into the counter 8.

Next, an embodiment of a wireless communication terminal apparatus using the transmitter according to the present invention will be described.

Figure 5:
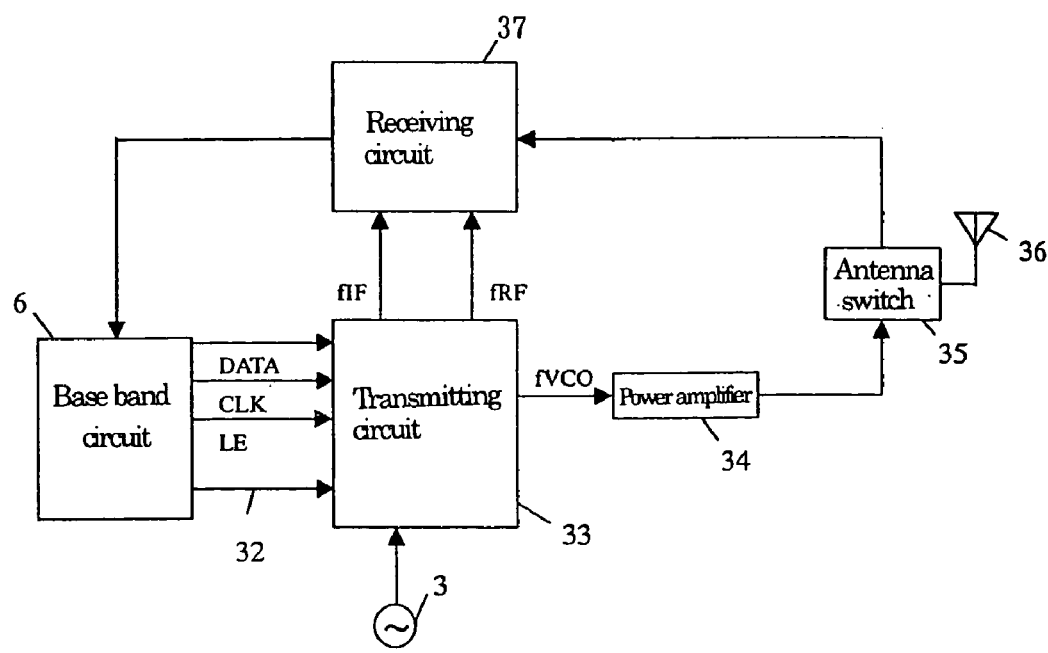
FIG. 5 is a functional block diagram showing an example of a wireless communication terminal apparatus using the transmitter according to the present invention.
Figure 6:
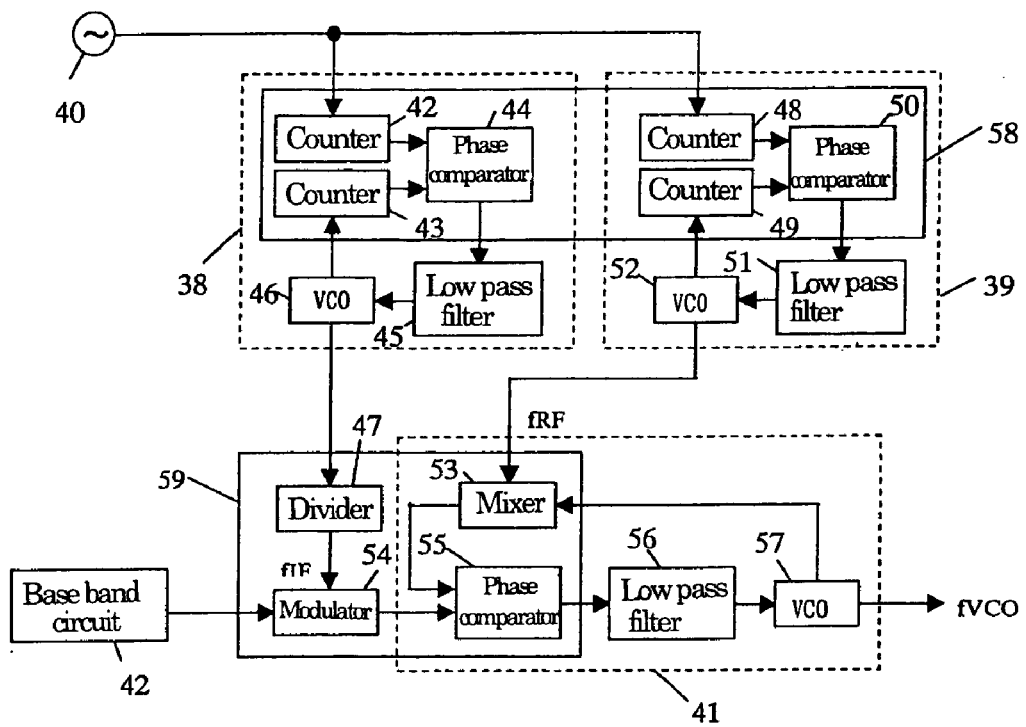
FIG. 6 is a functional block diagram showing a transmitter according to a comparative example which is an assumption of the present invention.
Figure 7:
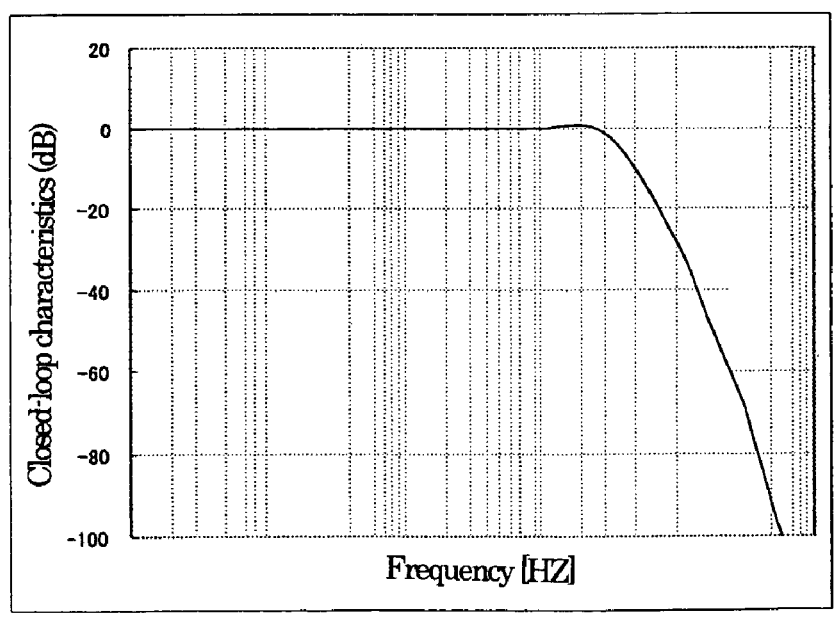
FIG. 7 is a characteristic diagram showing closed-loop characteristics of a PLL frequency conversion circuit.

FIG. 5 is a diagram showing the embodiment of the wireless communication terminal apparatus using the transmitter according to the present invention.

The wireless communication terminal apparatus according to the present invention is configured with the base band circuit 6, a transmitting circuit 33, a power amplifier 34, an antenna switch 35, an antenna 36, a receiving circuit 37, and the crystal oscillator 3.

The transmitting circuit 33 is configured with the first frequency synthesizer 1, the second frequency synthesizer 2, the PLL frequency conversion circuit 5, the divider 12, the modulator 18, and the control circuit 4 in FIG. 1, where the circuits surrounded by the solid line 29 are incorporated in a single IC. Alternatively, the transmitting circuit 33 is configured with the first frequency synthesizer 1, the second frequency synthesizer 2, the PLL frequency conversion circuit 5, the divider 12, the modulator 18, and the control circuit 4 in FIG. 3, where the circuits surrounded by the solid line 31 are incorporated in a single IC.

The clock signal CLK, the data signal DATA, the trigger signal LE, and a base band signal 32 are input from the base band circuit 6 into the transmitting circuit 3.

The output signal from the crystal oscillator 3 is input into the transmitting circuit 33 and used as reference signals for the first frequency synthesizer 1 and the second frequency synthesizer 2 both provided in the transmitting circuit 33.

There are three signals output from the transmitting circuit 33. A first output signal is an output signal from the PLL frequency conversion circuit 5, and the frequency thereof is the fVCO. A second output signal is an output signal from the divider 12, and the frequency thereof is the fIF. A third output signal is an output signal from the second frequency synthesizer 2, and the frequency thereof is the fRF. The first output signal from the transmitting circuit 33 is input into the power amplifier 34, where the power is amplified. The output signal from the power amplifier 34 is input into the antenna switch 35. The antenna 36, an output of the transmitting circuit 33, and an input of the receiving circuit 37 are connected to the antenna switch 35. In this wireless communication terminal apparatus, the antenna 36 and the output of the transmitting circuit 33 are electrically connected on the transmission, and the antenna 36 and the input of the receiving circuit 37 are electrically connected on the reception. In addition, a duplexer may be employed in place of the antenna switch 35.

A receiving signal received in the antenna 36 is input into the receiving circuit 37 through the antenna switch 35. The receiving circuit 37 uses the second and third output signals of the transmitting circuit 33 to downconvert this receiving signal up to the frequency which can be processed in the base band circuit 6 and to input it into the base band circuit 6. The circuits structuring the receiving circuit 37 may be manufactured in another IC from the IC structuring the transmitting circuit 33, further at least one circuit structuring the receiving circuit 37 may be incorporated in this IC.

Hereinbefore, the invention made by the present inventor is specifically described on the basis of the embodiments, but it goes without saying that the present invention is not limited to the above embodiments and various modifications can be made without departing from the scope and spirit thereof.

INDUSTRIAL APPLICABILITY

As described above, the transmitter according to the present invention is useful for a transmitter including a frequency synthesizer and a PLL frequency conversion circuit, and can be widely used in a wireless communication terminal apparatus using this transmitter, and the like, used in a wireless communication system such as the GSM, the DCS1800, or the like.

The invention claimed is:

1. A transmitter comprising a first frequency synthesizer; a second frequency synthesizer; a base band circuit for outputting a base band signal and a control signal on the basis of an information signal; a control circuit for changing output frequencies of the first frequency synthesizer and the second frequency synthesizer on the basis of the control signal; a modulator for assuming an output signal from the first frequency synthesizer to be a carrier signal and modulating the carrier signal on the basis of the base band signal; and a frequency conversion circuit for using an output signal from the modulator and an output signal from the second frequency synthesizer to upconvert a carrier frequency of the output signal from the modulator, wherein the frequency conversion circuit comprises a first phase comparator; a first low pass filter; a first VCO; and a mixer, and the frequency conversion circuit is a PLL frequency conversion circuit in which the first phase comparator outputs a signal proportional to a phase difference between an output signal from the modulator and an output signal from the mixer; the first low pass filter is connected to an output of the first phase comparator; the first VCO is connected to an output of the first low pass filter; the mixer is adopted to mix an output signal from the first VCO and an output signal from the second frequency synthesizer.

2. A transmitter according to claim 1, wherein the base band circuit stores a relationship between an output frequency of the frequency conversion circuit and output frequencies of the first frequency synthesizer and the second frequency synthesizer, and generates the control signal corresponding to the output frequency of the frequency conversion circuit on the basis of the relationship.

3. A transmitter according to claim 2, wherein the first frequency synthesizer comprises a first counter; a second counter; a second phase comparator; a second low pass filter; and a second VCO, in which the second phase comparator outputs a signal proportional to a phase difference between an output signal from the first counter and an output signal from the second counter; the first counter is connected to an output of a reference oscillator; the second counter is connected to an output of the second VCO; the second low pass filter is connected to an output of the second phase comparator; the second VCO is connected to an output of the second low pass filter; an~ a frequency ratio of the second counter can be changed by first frequency ratio data transmitted from the control circuit.

4. A transmitter according to claim 3, wherein the second frequency synthesizer comprises a third counter; a fourth counter; a third phase comparator; a third low pass filter; and a third VCO, in which the third phase comparator outputs a signal proportional to a phase difference between an output signal from the third counter and an output signal from the fourth counter; the third counter is connected to an output of the reference oscillator; the fourth counter is connected to an output of the third VCO; the third low pass filter is connected to an output of the third phase comparator; the third VCO is connected to an output of the third low pass filter; and a frequency ratio of the fourth counter can be changed by second frequency ratio data transmitted from the control circuit.

5. A transmitter according to claim 4, wherein the control circuit comprises a first register for holding third frequency ratio data; a second register for holding fourth frequency ratio data; a third register for holding the second frequency ratio data; and a first selector for selecting either one item of the third and fourth frequency ratio data on the basis of information included in the control signal to assume it to be the first frequency ratio data.

6. A transmitter according to claim 5, wherein the first counter, the second counter, the second phase comparator, the third counter, the fourth counter, the third phase comparator, the modulator, the divider, the first phase comparator, the mixer, and the control circuit are formed in the same IC.

7. A transmitter according to claim 4, wherein the control circuit comprises a fourth register for holding fifth frequency ratio data; a fifth register for holding sixth frequency ratio data; a sixth register for holding the seventh frequency ratio data; a seventh register for holding the second frequency ratio data; and a second selector for selecting one item of the fifth, sixth, and seventh frequency ratio data on the basis of information included in the control signal to assume it to be the first frequency ratio data.

8. A transmitter according to claim 7, wherein at least the first counter, the second counter, the second phase comparator, the third counter, the fourth counter, the third phase comparator, and the second VCO are formed in the same IC.

9. A transmitter according to claim 8, wherein the modulator, the divider, the first phase comparator, the mixer, and the control circuit are further formed in the same IC.

10. A wireless communication terminal apparatus, comprising a transmitting circuit connected to an output of a receiving circuit; the receiving circuit to which a first output signal and a second signal from the transmitting circuit are input; a power amplifier to which a third output signal from the transmitting circuit is input; an antenna switch connected to an input of the receiving circuit and to an output of the power amplifier; and an antenna connected to the antenna switch,
- wherein the transmitting circuit is a transmitter according to claim 1;
- the first output signal and the second output signal are an output signal from a second frequency synthesizer and an input signal to a modulator both in the transmitting circuit, respectively;
- the third output signal is an output signal from a first VCO provided in the transmitting circuit; and
- an output signal from the receiving circuit is input into the base band circuit in the transmitting circuit, where an information signal is fetched out.

11. A wireless communication terminal apparatus according to claim 10, wherein a duplexer is used in place of the antenna switch.

12. A transmitter according to claim 1, wherein a first output frequency of the first frequency synthesizer and a second output frequency of the second frequency synthesizer are set in a frequency relationship where undesired spurs appear out of a band of the PLL.

13. A transmitter according to claim 12, wherein output signals from the first frequency synthesizer and the second frequency synthesizer are used at a receiver side; and
- the first output frequency is set to be different between when it is used at the transmitter side and when it is used at the receiver side.

14. A transmitter comprising a first frequency synthesizer; a second frequency synthesizer; a base band circuit for outputting a base band signal and a control signal on the basis of an information signal; a control circuit for changing output frequencies of the first frequency synthesizer and the second frequency synthesizer on the basis of the control signal; a divider for dividing an output signal from the first frequency synthesizer; a modulator for assuming an output signal from the divider to be a carrier signal and modulating the carrier signal on the basis of the base band signal; and a frequency conversion circuit for using an output signal from the modulator and an output signal from the second frequency synthesizer to upconvert a carrier frequency of the output signal from the modulator,
- wherein the frequency conversion circuit comprises a first phase comparator; a first low pass filter; a first VCO; and a mixer, and the frequency conversion circuit is a PLL frequency conversion circuit in which the first phase comparator outputs a signal proportional to a phase difference between an output signal from the modulator and an output signal from the mixer; the first low pass filter is connected to an output of the first phase comparator; the first VCO is connected to an output of the first low pass filter; the mixer is adopted to mix an output signal from the first VCO and an output signal from the second frequency synthesizer.

* * * * *